US006180696B1

(12) United States Patent
Wong et al.

(10) Patent No.: US 6,180,696 B1
(45) Date of Patent: Jan. 30, 2001

(54) NO-FLOW UNDERFILL OF EPOXY RESIN, ANHYDRIDE, FLUXING AGENT AND SURFACTANT

(75) Inventors: Ching-Ping Wong, Berkley Lake; Song-Hua Shi, Atlanta, both of GA (US)

(73) Assignee: Georgia Tech Research Corporation, Atlanta, GA (US)

( * ) Notice: Under 35 U.S.C. 154(b), the term of this patent shall be extended for 0 days.

(21) Appl. No.: 09/025,532

(22) Filed: Feb. 18, 1998

Related U.S. Application Data

(60) Provisional application No. 60/038,108, filed on Feb. 19, 1997, and provisional application No. 60/069,179, filed on Dec. 11, 1997.

(51) Int. Cl.[7] ............... C08K 3/10; C08K 3/34; C08K 3/36; C08L 63/00
(52) U.S. Cl. ............ 523/457; 523/456; 523/466; 525/407; 525/508; 525/533
(58) Field of Search .................... 523/402, 456, 523/466, 457; 525/508, 533, 407

(56) References Cited

U.S. PATENT DOCUMENTS

| | | | |
|---|---|---|---|
| 4,999,699 | 3/1991 | Christie et al. | 357/65 |
| 5,121,190 | 6/1992 | Hsiao et al. | 357/80 |
| 5,128,746 | 7/1992 | Pennisi et al. | 357/72 |
| 5,194,930 | 3/1993 | Papathomas et al. | 257/773 |
| 5,376,403 | 12/1994 | Capote | 427/96 |
| 5,644,003 | 7/1997 | Arai et al. | 525/423 |

*Primary Examiner*—Robert E. L. Sellers
(74) *Attorney, Agent, or Firm*—Thomas, Kayden, Horstemeyer & Risley, LLP

(57) ABSTRACT

An epoxy material suitable for no-flow underfilling processes with high glass transition temperature can be obtained by curing a solvent free formulation containing an epoxy resin, an organic carboxylic acid anhydride hardener, a curing accelerator, a fluxing agent, a viscosity controlling agent, a coupling agent, and a surfactant.

15 Claims, No Drawings

NO-FLOW UNDERFILL OF EPOXY RESIN, ANHYDRIDE, FLUXING AGENT AND SURFACTANT

RELATED APPLICATIONS

This application is hereby claims priority to, and incorporates herein by reference, provisional Application No. 60/038,108, Low-Cost High Performance No-Flow Underfills For Flip Chip Device Applications filed Feb. 19, 1997, and provisional Application No. 60/069,179, filed Dec. 11, 1997, entitled "Low-Cost High-Performance No-Flow Underfills For Flip Chip Device Applications."

FIELD OF THE INVENTION

This present invention is concerned with epoxy materials which can be simultaneously cured during solder bump reflow in applying flip-chip technology. After being cured, the epoxy material has relatively high glass transition temperature as well as excellent electrical and mechanical properties. Therefore, the present invention provides a new inexpensive polymeric material suitable for no-flow underfilling processes in current industrial production of solder interconnected structures for jointing semiconductor devices to substrates. The underfill material can significantly improve the fatigue life of the interconnected structures.

BACKGROUND OF THE INVENTION

Semiconductor devices are widely used in many products. An important trend of developing semiconductor device is the miniaturization of the products using high density semiconductor devices. However, competing with this need for smaller dimensions is the increasing need for functionality that the consumers of semiconductor devices demand. The increase in functionality tends to increase the size and complexity of the semiconductor devices and the number of semiconductor devices per module. This trend consequently results in area distributed I/O terminals and corresponding $C^4$ area bonding technique.

Another significant factor is maintaining low cost of manufacturing despite the increase in semiconductor device complexity and density. One significant cost in manufacturing a semiconductor device is the lead frame. As a result, direct chip attach (DCA) type assemblies are gaining popularity. In DCA, the pads of a semiconductor device are directly attached to a substrate, such as PCB. Thus the cost and size of an individual package for the semiconductor device is reduced.

While $C^4$ (controlled collapse chip connection) and DCA techniques becomes popular, the problem with thermal coefficient of expansion (TCE) mismatch between chip and substrate carrier becomes serious in particular with the larger integrated circuit (IC) chips, high TCE, low-cost organic substrate, and smaller solder joints. Due to the TCE mismatch between the silicon IC (2.5 ppm) and low cost organic substrate, in particularly, the FR-4 (18–24 ppm) printed wiring board, the temperature cycling excursions generate thermomechanical stresses to the solder joints and result in performance degradation of packaged systems.

Underfill encapsulant is used to reinforce physical, mechanical and electrical properties of the solder joints connecting the chip and the substrate. The encapsulant does not only provide dramatic fatigue life enhancement, but also extends its use to a variety of organic and inorganic substrate materials, resulting in ten to hundred fold improvement in fatigue life as compared to an unencapsulated package. Therefore, the new technique of underfill encapsulation has been gaining increasing acceptance.

However, more than 90% of current underfill encapsulants dispense liquid encapsulants on one or two edges of an assembled flip-chip package. This allows capillary action to draw the underfill into the gap between the chip and substrate of the assembled package to complete the encapsulation process. This process has two disadvantages: (1) The process of reflowing solder bump and the process of underfilling and curing the encapsulants are separated, which result in lower production efficiency. (2) The limit of capillary force results in the limit of flow distance for underfill materials, which further limits the chip size. As such it becomes a production bottleneck.

A no-flow underfilling process was invented to dispense the underfill materials on the substrate or the semiconductor devices at first, then perform the solder bump reflowing and underfill encapsulant curing simultaneously. Therefore, no-flow underfilling process not only eliminates the strict limits on the viscosity of underfill materials and package size, but also improves the production efficiency. Pennisi et al, in one of their patents [U.S. Pat. No. 5,128,746], described the similar process as the no-flow underfilling process and herein cited as a reference. Till now, however, no-flow underfilling process has not been practically used in industrial mass production. The reason mainly lies in lacking of a successful no-flow underfill material.

A successful no-flow underfill encapsulant should meet primary requirements: (1) minimal curing reaction should occur at the temperature below solder bump reflow temperature (~190–230° C.). (2) rapid curing reaction should take place after the maximum solder bump reflow temperature. (3) good adhesion to passivation layer, chip, substrate, solder mask, and solder joints. (4) reasonable shrinkage of the material during curing. (5) low TCE. (6) self-fluxing ability. (7) exhibit a reasonable modulus to minimize the residual thermal stress resulted from the curing process and sequence temperature cycling condition.

Silica filled epoxy resins were most widely investigated candidates due to their low cost and good integrated properties. There are many kinds of epoxy resins in current market, and the formulations based on these epoxy resins and protected by patents are enormous. Most of these formulations are based on aromatic epoxy resin such as bisphenol A type epoxy resin and bisphenol F type epoxy resin, and the Tg of these formulations after curing generally ranges from 100 to 140° C. Polynuclear aromatic epoxides are now under developing, especially in Japan, and the Tg of cured polynuclear aromatic epoxides generally ranges from 180 to 220° C., which is close to the Tg of polyimide (250° C.). Some research results of polynuclear aromatic epoxides were reported in "*Polymeric Materials for Microelectronics Applications*" edited by Hiroshi Ito, Seiichi Tagawa, and Kazuyuki Horie. However, most of polynuclear aromatic phenols are cancer suspending chemicals and the cost of producing them are relatively high. As such, they are not widely used in the industries. Cycloaliphatic epoxides has been commercialized many years ago and its market price is relatively inexpensive. Cycloaliphatic epoxide attracts increasing attentions due to its lacking of phenylene UV chromophore, low concentration of mobile chlorine ion, and low viscosity. Papathomas et al in one of their patents [U.S. Pat. No. 5,194,930] developed cycloaliphatic epoxide/ anhydride system for solder interconnection structure application in flip-chip technology and herein cited as a reference. But they did not mention any catalyst, fluxing agents and viscosity controlling agents suitable for no-flow underfill formulations. Instead, they used glycol as curing accelerator with curing peak temperature around 160° C. which is out of useful range for no-flow underfill applications. Pennisi et al, in one of their patents [U.S. Pat. No. 5,128,746] developed an epoxy based material for their processing, but they did not realize the importance of the viscosity controlling agents and silane coupling agents for no-flow underfilling process. Moreover, their material contains organic acid type fluxing agent, which is corrosive to the solder interconnects.

SUMMARY OF THE INVENTION

The present invention relates to a no-flow underfill material obtained by curing a formulation including an epoxy resin and/or a mixture of several epoxy resins, an organic carboxylic acid anhydride hardener, a curing accelerator, a self-fluxing agent, a viscosity-controlling agent, a coupling agent, a surfactant. In a preferred embodiment, a curing accelerator may be selected from the group consisting of triphenylphosphine, alkyl-substituted imidazoles, imidazolium salts, onium borates, metal chelates, or a mixture thereof More specifically, the epoxy resin may be selected from cycloaliphatic epoxy resins, bisphenol-A type epoxy resins, bisphenol-F type epoxy resins, epoxy novolac resins, biphenyl type epoxy resins, naphthalene type epoxy resins, dicyclopentadiene-phenol type epoxy resins, or mictures thereof. Furthermore, the organic carboxylic acid ahnydride hardener is selected from the group consisting of hexahydrophthalic anhydride, methyl hexahydrophthalic anhydride, and the mixtures thereof.

In one embodiment, the metal chelates are selected from the group consisting of metal acetylacetonates, metal acetates, metal halides, metal imidazole complexes, metal amine complexes. In a preferred embodiment, the metal ions are selected from the group consisting of $Sc^{3+}$, $Cu^{2+}$, $Mo^{2+}$, $Ru^{3+}$, $Rh^{3+}$, $Cd^{2+}$, $La^{3+}$, $Hf^{4+}$, $In^{3+}$, $Tl^{1+}$, $Tl^{3+}$, $Pb^{2+}$, $Pb^{3+}$, $Ti^{4+}$, $Ce^{3+}$, $Ce^{4+}$, $Pr^{3+}$, $Eu^{3+}$, $Gd^{3+}$, $Tb^{3+}$, $Dy^{3+}$, $Ho^{3+}$, $Er^{3+}$, $Tm^{3+}$, $Lu^{3+}$, $Th^{3+}$, $Co^{2+}$, $Co^{3+}$, $Fe^{2+}$, $Fe^{3+}$, $Ni^{2+}$, $Pd^{2+}$, $Pt^{2+}$, $Ga^{3+}$, $Y^{3+}$, $V^{3+}$, $Sm^{3+}$, $Nd^{3+}$, $Cr^{3+}$, $Li^{1+}$, $Be^{2+}$, $K^{1+}$, $Ca^{2+}$, $Na^{1+}$, $Ba^{2+}$, $Sr^{2+}$, $Zn^{2+}$, $Mg^{2+}$.

In another embodiment, the self-fluxing agent is selected from the group consisting of the chemicals that contains one or more hydroxyl groups (—OH). Specifically, the chemicals are selected from the group consisting of the ethylene glycol, glycerol, 3-[bis(glycidyl oxy methyl)methoxy]-1,2-propane diol, D-ribose, D-cellobiose, cellulose, and 3-cyclohexene-1,1-dimethanol. Furthermore, in a preferred embodiment, the coupling agent is selected from the group consisting of silane coupling agents. More specifically, the silane coupling agents is selected from the group of epoxy type silane coupling agent, amine type silane coupling agent, mercapto type silane soupling agent, or a mixture thereof.

In a further embodiment, the surfactant is a non-ionic surfactant which are selected from the group consisting of silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, and fatty alcohol polyoxyalkylene alkyl ethers.

Finally, the inventive material may also include a filler material from the group consisting of silica particles, silicon nitride particles, and aluminum nitride particles.

Accordingly, it is an the objective of this invention to provide an inexpensive epoxy base polymeric composition/formulation with curing peak temperature ranging from 180 to 240° C., suitable rheologic characteristics and excellent fluxing activity, which meets the requirements of the no-flow underfilling process for low melting point solder bumps such as eutectic tin/lead alloy. The polymeric composition/formulation also provides high glass transition temperature (Tg), excellent electrical properties and mechanical properties upon curing.

Our further objective of the invention is to provide a composition/formulation suitable for no-flow underfilling applications for DCA and flip-chip packaging technology.

DETAILED DESCRIPTION OF THE PREFERRED EMBODIMENT

The present invention may be understood more readily by reference to the following detailed description of preferred embodiments of the invention.

The term "alkyl" as used herein refers to a branched or unbranched saturated hydrocarbon group of 1 to 24 carbon atoms, such as methyl ("Me"), ethyl ("Et"), n-propyl, isopropyl, n-butyl, isobutyl, t-butyl, octyl, decyl, and the like. Preferred alkyl groups herein contain from 1 to 12 carbon atoms.

By the term "effective amount" of a compound, product, or composition as provided herein is meant a sufficient amount of the compound, product or composition to provide the desired results. As will be pointed out below, the exact amount required will vary from substrate to substrate, depending on the particular compound, product or composition used, its mode of administration, and the like. Thus, it is not always possible to specify an exact "effective amount." However, an appropriate effective amount may be determined by one of ordinary skill in the art using only routine experimentation.

As used herein, the term "suitable" is used to refer to a moiety which is compatible with the compounds, products, or compositions as provided herein for the stated purpose. Suitability for the stated purpose may be determined by one of ordinary skill in the art using only routine experimentation.

As used herein, "substituted" is used to refer, generally, to a carbon or suitable heteroatom having a hydrogen or other atom removed and replaced with a further moiety. Moreover, it is intended that "substituted" refer to substitutions which do not change the basic and novel utility of the underlying compounds, products or compositions of the present invention.

Cycloaliphatic epoxy resins are particularly useful for electronic insulation and microelectronic encapsulation because they do not have aromatic rings and therefore, lack a strong UV chromophore. Consequently, they prove to be more durable for outdoor applications. Additionally, cycloaliphatic epoxy resins are manufactured by epoxidation of carbon-carbon double bond, not through condensation of epichlorohydrin with phenols. This eliminates the possible corrosion of fine wires or electrical interconnections in packaged IC devices by mobile chloride ions. Lastly, the viscosity of the cycloaliphatic epoxy resins is generally lower than that of other epoxy resins. This allows the preparation of epoxy based formulations with higher filler loading for TCE controll, such as in microelectronic encapsulation and underfill applications. Besides the cycloaliphatic epoxy resins, bisphenol-A type epoxy resins, bisphenol-F type epoxy resins, epoxy novolac resins, biphenyl type epoxy resins, naphthalene type epoxy resins and dicyclopentadienephenol type epoxy resins are also used in an underfill formulation. These epoxy resins are used to optimize the integrated properties of the cured formulation such as toughness, moisture absorption, elongation and etc.

Carboxylic acid anhydride is employed as an epoxy hardener in microelectronic application formulations because the electrical properties such as the dielectric constant, and glass transition temperature (Tg) of cured formulations using anhydride hardener are generally better than those using amine type hardeners. Furthermore, anhydride hardener is a type of high temperature curing hardener, which will not react with epoxy resins at room temperature unless catalyzed by other chemicals. So that the pot-life of the formulations using these hardeners will be relatively longer. However, these compounds can quickly cure the epoxy resins at reasonably elevated temperatures with the aid of catalysts.

No-flow underfilling process requires that the underfill material should provide such curing characteristics: that is, minimal curing takes place before solder reflow and rapid curing occurs just after the solder reflow. Therefore, the selection of the latent catalysts is critical for the underfill materials. These latent catalyst can be selected from the group of alkyl-substituted imidazole, triphenylphosphine, imidazolium salts, onium borate, metal chelates, and the mixture thereof.

Since no-flow underfilling process reflows the solder joint and cure the underfill materials at the same time, proper selection of fluxing agent is one of the key parameters in designing a successful no-flow underfill formulation. The employed fluxing agent must be able to remove the metal oxide from the copper conductor pads of the PWB and prevent the solder melt from reoxidation during the high temperature curing of a no-flow underfill formulation. At the same time, the fluxing agents should not cause noticeable negative effects on the curing profile and final properties of the no-flow underfill materials. Various organic acids are suitable as oxide removing agents and various alcohols are suitable as antioxidants (U.S. Pat. No. 5,376,403) which have very low vapor pressure at solder reflow temperature. However, since most of the organic acids interfere with the curing profile and cause corrosive to solder interconnects, they can not be used in the no-flow underfill materials. Therefore we found a new class of fluxing agents which is basically the chemicals containing one or more than one hydroxyl groups (—OH groups). The chemicals can provide excellent fluxing activities with little corrosive effect to the solder interconnects and the IC. Ethylene glycol, glycerol, 3-[bis(glycidyl oxy methyl)methoxy]-1,2-propane diol, D-ribose, D-cellobiose, cellulose, 3-cyclohexene-1,1-dimethanol, $H_2O$ are just the examples.

Vicosity and rheologic behavior of a no-flow underfill material is another key prarameter for no-flow underfilling process. If the viscosity of the no-flow underfill material is too low, the flat or creased surface of the underfill drop can trap air bubbles when the chip is compressed down. If the viscosity is too high, the force needed to have the bump penetrate through the underfill material can be out of the function range of a flip-chip bonding machine. Moreover, the high viscosity can prevent the formation of good interconnects due to the buoyancy force of the material resulting from the material viscoelastic nature. Besides the viscosity, the rheologic behavior (refer to Newtonian, shear-thinning or shear thickening) is also very important to prevent the process voiding. Amorphous fumed silica was found to be very effective in controlling the viscosity and rheologic behavior of a no-flow underfill material. Treated silylated amorphous fumed silica such as CAB-O-SIL TS-720 from Cabot Corporation and untreated amorphous fumed silica such as CAB-O-SIL M-5 from Cabot Corporation are just the examples.

Silane coupling is another key component in designing a successful no-flow underfill material. It is used mainly to improve the adhesion between the chip to underfill material and between the underfill material to the substrate. Any type of silane coupling agent can be used in a no-flow underfill materials. The preferred silane coupling agents used in the invention include amine, epoxy, mercapto, styryl and chloroalkyl type silane coupling agents.

Using surfactant in a no-flow underfill material is another way to prevent the process voiding during the flip-chip bonding and subsequent solder joint reflow and material curing. These surfactant can be selected from silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, and fatty alcohol polyoxyalkylene alkyl ethers.

With this in mind, the present invention provides the products consist of: (a) a mixture of a cycloaliphatic epoxide, bisphenol A type epoxide, and a bisphenol F type epoxide, an epoxy novolac resin, a biphenyl type epoxy resin, a naphthalene type epoxy resin and a dicyclopentadiene-phenol type epoxy resin; (b) an organic carboxylic acid anhydride hardener; (c) a curing accelerator, wherein said curing accelerator is selected from the group consisting of alkyl-substituted imidazole, triphenylphosphine, imidazolium salts, onium borates, metal chelates or the mixture thereof; (d) a fluxing agent selected from the group consisting of any chemicals containing —OH group; (e) a Theological viscosity controlling agent; (f) a silane coupling agent; (g) a surfactant.

The cycloaliphatic type epoxides employed as the preferred resin ingredient in the invention are selected from non-glycidyl ether epoxides containing more than one 1,2 epoxy group per molecule. These are generally prepared by epoxidizing unsaturated cyclic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides or ketones to give the compound R—COOOH. These materials are well known in the art and reference may be made to Brydson, J., Plastic Materials, 1966, P. 471, incorporated herein as reference and made a part hereof, for their synthesis and description.

Such non-glycidyl ether cycloaliphatic epoxides are characterized by having a ring structure wherein the epoxide group may be part of the ring or may be attached to the ring structure. These epoxides may also contain ester linkages. The ester linkages are generally not near the epoxide group and are relatively inert to reactions.

Examples of non-glycidyl ether cycloaliphatic epoxides would include 3,4-epoxycyclohexylmethyl-3, 4-epoxycyclohexane carboxylate (containing two epoxide groups which are part of the ring structures, and an ester linkage); vinylcyclohexene dioxide (containing two epoxide groups, one of which is part of a ring structure); 3,4-epoxy-6-methyl cyclohexyl methyl-3, 4-epoxycyclohexane carboxylate and dicyclopentadiene dioxide, having the following respective structures:

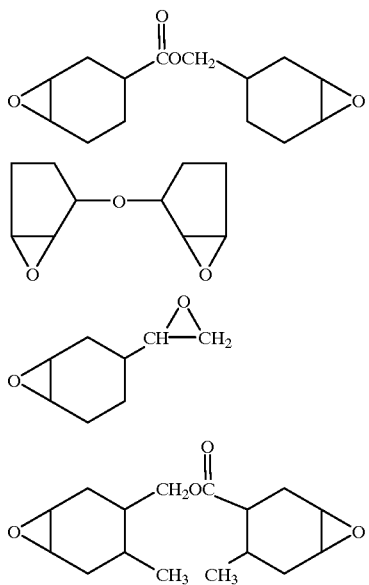

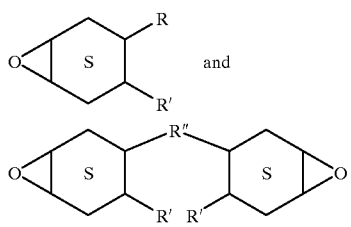

A distinguishing feature of many of the cycloaliphatic epoxides is the location of the epoxy group(s) on a ring structure rather than on an aliphatic side chain. Generally, the cycloaliphatic epoxide particularly useful in this invention will have the formula selected from the group consisting of:

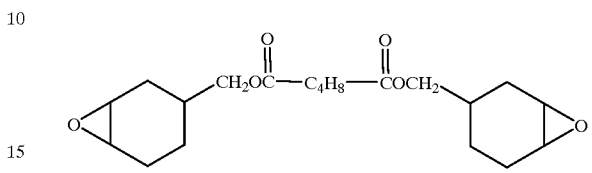

where S stands for a saturated ring structure, R is selected from the alkyl group consisting of $CHOCH_2$, $O(CH_2)_n CHOCH_2$ and $OC(CH_3)_2CHOCH_2$ radicals where n=1 to 5, R' is selected from the group consisting of hydrogen, methyl, ethyl, propyl, butyl, and benzyl radicals and R" is selected from the group consisting of O, $CH_2OOC$, and $CH_2OOC(CH_2)_4COO$ radicals.

These cycloaliphatic epoxy resins may be characterized by reference to their epoxy equivalent weight, which is defined as the weight of epoxide in grams which contains one equivalent of epoxy. Suitable cycloaliphatic epoxy resins have a preferred epoxy equivalent weight from about 50 to about 250. They will generally have a viscosity between about 5 to about 900 cp at 25° C.

Examples of cycloaliphatic epoxides are suggested in U.S. Pat. Nos. 5,194,930; 3,207,357; 2,890,194; 2,890,197; and 4,294,746, disclosures of which are incorporated herein for reference. Some specific examples of suitable cycloaliphatic epoxides are: 3, 4-epoxycyclohexylmethyl-3, 4-epoxycyclohexane carboxylate available from the Union Carbide under the trade designation ERL-4221; bis (3,4-epoxycyclohexyl)adipate, having the following structure:

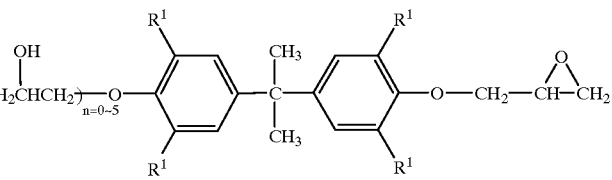

and available from Union Carbide under the trade designation ERL-4299; and vinyl cyclohexene diepoxide, available from Union Carbide under the trade designation ERL-4206.

A discussion of various cycloaliphatic epoxides can be found in the publication entitled "Cycloaliphatic Epoxide Systems," Union Carbide, 1970, the disclosure of which is also incorporated herein by reference and made a part hereof. Mixtures of cycloaliphatic epoxides can be employed when desired. The preferred cycloaliphatic epoxides are 3,4-epoxycyelohexylmethyl-3,4-epoxycyclohexane carboxylate, vinyl cyclohexene diepoxide, and mixtures thereof.

The bisphenol A type epoxides employed as the preferred resin ingredient in the invention are selected from glycidyl ether epoxides containing more than one 1,2 epoxy group per molecule. These are generally prepared by the reaction of 1 mole bisphenol A and 2 mole epichlorohydrin in basic media. The detailed preparation procedure can be found in huge quantities of technical papers and patents. Generally, the bisphenol A type epoxide particularly useful in this invention will have the formula selected from the group consisting of:

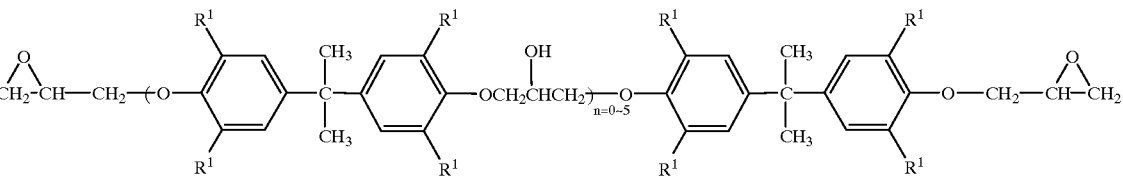

where $R^1$ is H, Br or $CH_3$. The preferred bisphenol A type epoxides in this invention are 2,2-bis(4-hydroxyphenyl) propane-epichlorohydrin copolymer ($R^1$=H) and 2,2'-{(3,3', 5,5'-tetramethyl{1,1'-biphenyl}-4,4'-diyl)bis (oxymethylene)}bisoxirane($R^1$=$CH_3$), and mixtures thereof The epoxy equivalent weight for the two epoxy resins ranges from about 100 to about 500.

The bisphenol F type epoxides employed as the preferred resin ingredient in the invention are selected from glycidyl ether epoxides containing more than one 1,2 epoxy group per molecule. These are generally prepared by the reaction of 1 mole bisphenol F and 2 mole epichlorohydrin in basic media. The detailed preparation procedure can be found in huge quantities of technical papers and patents. The preferred bisphenol F type epoxides in this invention will have the formula selected from the group consisting of:

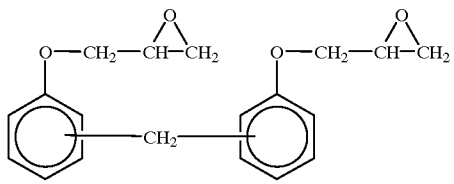

The preferred epoxy equivalent weight for the bisphenol F epoxy resin ranges from about 150 to about 500. EPON RESIN 862 from Shell Chemicals Co. is just an example.

The epoxy novolac resin employed as the preferred resin ingredient in the invention is selected from glycidyl ether epoxides containing more than one 1,2 epoxy group per molecule. These are generally prepared by the reaction of phenolic resin and epichlorohydrin in basic media. The detailed preparation procedure can be found in huge quantities of technical papers and patents. Generally, the epoxy novolac resin particularly useful in this invention will have the formula selected from the group consisting of:

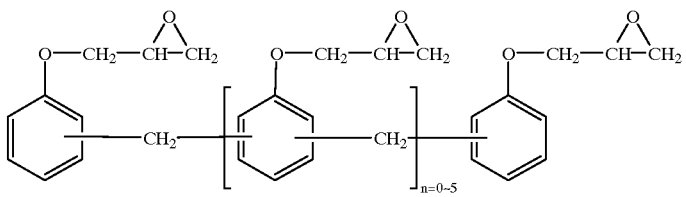

The preferred epoxy novolac resin in this invention is poly(phenyl glycidyl ether)-co-formaldehyde. The epoxy equivalent weight for this epoxy novolac resin ranges from about 200 to about 500.

The biphenyl type epoxy resin employed as the preferred resin ingredient in the invention is selected from glycidyl ether epoxides containing more than one 1,2 epoxy group per molecule. These are generally prepared by the reaction of biphenyl resin and epichlorohydrin in basic media. The detailed preparation procedure can be found in huge quantities of technical literatures and patents. Generally, the biphenyl type epoxy resin in this invention will have the formula selected from the group consisting of:

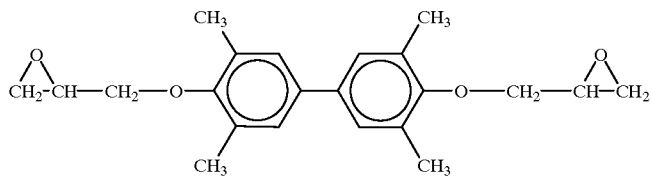

The epoxy equivalent weight for this biphenyl type epoxy resin ranges from about 150 to about 500. YX4000H epoxy resin from Yuka Shell Epoxy Kabushiki Kaisha is just an example.

The naphthalene type epoxy resin employed as the preferred resin ingredient in the invention is selected from the ones whose chemical structure are as follows.

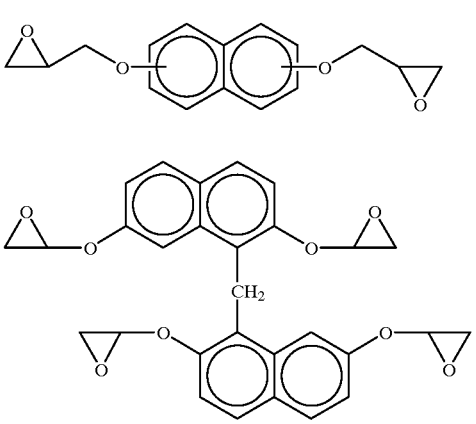

The epoxy equivalent weight for these two naphthalene type epoxy resin ranges from about 150 to about 500. HP-4032 and EXA-4700 epoxy resins from Dainippon Ink and Chemicals, Inc. are just two examples.

The dicyclopentadiene-phenol type epoxy resin employed as the preferred resin ingredient in the invention is selected from multi-functional epoxy resins derived from poly-addition compound of dicyclopentadiene and phenol. These are generally prepared by the reaction of dicyclopentadiene phenol resin and epichlorohydrin in basic media. The detailed preparation procedure can be found in huge quantities of technical papers and patents. Generally, the dicyclopentadiene-phenol type epoxy resin useful in this invention will have the formula selected from the group consisting of the formula as follows.

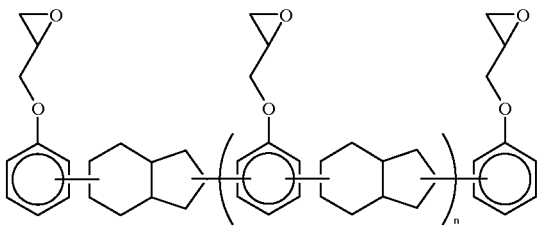

The epoxy equivalent weight for this epoxy resin ranges from about 150 to about 500. HP-7200 epoxy resin from Dainippon Ink & Chemicals, Inc. is just an example.

The hardening agent is preferably in a liquid form. If a solid hardening agent is employed, such should be melted when added to the composition. Examples of suitable anhydride hardeners are methyl-tetrahydrophthalic anhydride, hexahydrophthalic anhydride, maleic anhydride, trimellitic anhydride, pyromellitic anhydride, tetrahydrophthalic anhydride, phthalic anhydride, norbornenedicarboxylic anhydride, nadic methyl anhydride, and methylcyclohexane-1, 2 dicarboxylic anhydride. Additional anhydrides can be found, for instance, in H. Lee and K. Neville, Handbook of Epoxy Resin, McGraw Hill, 1967, Chapter 12, disclosure of which is incorporated herein by reference and made a part hereof. Preferred organic carboxylic acid anhydride hardeners include hexahydrophthalic anhydride, methyl hexahydrophthalic anhydride, and mixtures thereof, having the following respective structures:

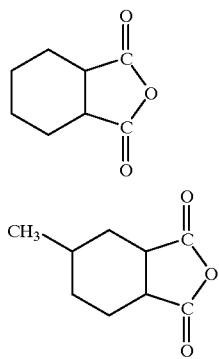

A curing accelerator is a substance which increases, catalytically, the hardening rate of a synthetic resin. The catalyst is selected to make the curing reaction occur at the desired temperature range. It has been found that the selection of the catalyst can influence the latency of the underfill formulation. alkyl-substituted imidazole, triphenylphosphine, imidazolium salts, onium-borate compounds, metal chelates, and the mixture thereof are suitable catalysts in the present invention to obtain a successful no-flow underfill material.

The catalytic mechanism of imidazolium salts in epoxide/anhydride systems is similar to imidazole because the imidazolium salt is decomposed into imidazole with the aid of trace moisture at a temperature of 180° C. to 200° C. Imidazolium salts suitable for use in this invention are characterized by the general formula:

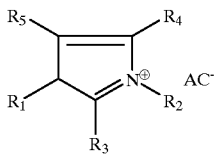

where $R_1$, $R_2$, $R_3$, $R_4$, and $R_5$, can be the same or different and are selected from the group consisting of H, $C_{1-6}$ alkyls, and phenyl. The anionic counter ion $AC^-$ can be any suitable anionic moiety, Preferably $AC^-$ is selected from the group consisting of $OAC^-$, $AcAc^-$, $C_{1-6}$ alkyl substituted $OAc^-$, $C_{1-6}$ alkyl substituted $I^-$, $Br^-$, $Cl^-$, $BF_4^-$, $PF_6^-$, $AsF_6^-$, $SbF_6^-$, and $CF_3SO_3^-$. The preferred imidazolium compounds are $R_4=R_5=H$; $R_1$, $R_2$, and $R_3$ are selected from the group consisting of H, methyl, ethyl, butyl, and phenyl; and $AC^-$ is selected from the group consisting of $I^-$, $Br^-$, $Cl^-$ and $PF_6^-$ and $BF_4^-$.

The general chemical structure of metal chelate is:

where $M^{y+}$ is selected from the group consisting of the transition metal ions, $L^{n-}$ is the organic ligand of $M^{y+}$, x is the coordination number of $L^{n-}$ to $M^{y+}$. A is the counter ion to the $(L^{n-})_xM^{y+}$. y is the number of positive charge of M and is 0 to 6. n is the negative charge of L and is 0 to 4. m can be either 0, positive or negative, but the value must meet the equation below:

$$mz=y-nx$$

If mz=0, A is not needed; mz>0, then A has negative charges; if mz<0, then A has positive charges. Examples of suitable metal chelates include metal acetylacetonate, metal acetates, metal halides, metal imidazole complex, metal amine complex. The metal ions can be selected from the groups consisting of $Sc^{3+}$, $Cu^{2+}$, $Mo^{2+}$, $Ru^{3+}$, $Rh^{3+}$, $Cd^{2+}$, $La^{3+}$, $Hf^{4+}$, $In^{3+}$, $Tl^{1+}$, $Tl^{3+}$, $Pb^{2+}$, $Pb^{3+}$, $Ti^{4+}$, $Ce^{3+}$, $Ce^{4+}$, $Pr^{3+}$, $Eu^{3+}$, $Gd^{3+}$, $Tb^{3+}$, $Dy^{3+}$, $Ho^{3+}$, $Er^{3+}$, $Tm^{3+}$, $Lu^{3+}$, $Th^{3+}$, $Co^{2+}$, $Co^{3+}$, $Fe^{2+}$, $Fe^{3+}$, $Ni^{2+}$, $Pd^{2+}$, $Pt^{2+}$, $Ga^{3+}$, $Y^{3+}$, $V^{3+}$, $Sm^{3+}$, $Nd^{3+}$, $Cr^{3+}$, $Li^{1+}$, $Be^{2+}$, $K^{1+}$, $Ca^{2+}$, $Na^{1+}$, $Ba^{2+}$, $Sr^{2+}$, $Zn^{2+}$, $Mg^{2+}$. The mechanism by which metal chelates catalyze epoxy/anhydride systems is not clear. But most likely is through the release of the ligand during heating.

The general chemical structure of triphenylphospine is:

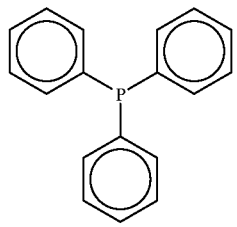

The general chemical structure of onium-borate is:

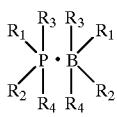

where $R_1$, $R_2$, $R_3$, $R_4$, can be the same or different, and are selected from the group consisting of $C_{1-10}$ alkyls and phenyl. The preferred onium-borate is $R_1=R_2=R_3=$phenyl;

and $R_4$ is selected from the group consisting of phenyl and $C_{1-10}$ alkyls.

Fluxing agents generally consist of two components characteristics, i.e. removing metal oxides and preventing reoxidation. Generally, the fluxing agent consists of organic acids and low vapor pressure alcohols. The organic acids include maleic acid, citric acid, tartaric acid, salicylic acid, adipic acid, glutaric acid, 4-hydroxy benzoic acid, anisic acid, oleic acid, stearic acid, linoleic acid, fatty acid, and dicarboxylic acids of the formula $HO_2C—(CH_2)_n—CO_2H$, where $4 \leq n \leq 20$. The low vapor pressure alcohols include sorbitol, mannite, polyethylene glycol ($400 \leq MW \leq 2000$), cholesterol, and cooking oils such as corn or peanut oil. However, all these fluxing agents will not only change the curing profile, but also cause corrosion to the solder interconnects. To avoid this problem, the fluxing agent used in the invention mainly selected from the group consisting of any chemicals containing —OH group. Such chemicals include alcohols, $H_2O$, hydroxyl acid, hydroxyl base. The substance employed as the preferred ingredient in the invention are selected from the polyols such as the ethylene glycol, glycerol, 3-[bis(glycidyl oxy methyl)methoxy]-1,2-propane diol, D-ribose, D-cellobiose, cellulose, 3-cyclohexene-1,1-dimethanol, $H_2O$ and the like.

Vicosity and rheology controlling agents must be inert with other componets in a no-flow underfill material and should not negatively affect the curing kinetics, and physical and mechanical properties after cure. The preferred viscosity controlling agent used in the invention is amorphous fumed silica. Treated amorphous fumed silica such as CAB-O-SIL TS-720 from Cabot Corporation and untreated amorphous fumed silica such as CAB-O-SIL M-5 from Cabot Corporation are just the examples.

The silane coupling agent is a chemical substance which is used to improve the adhesion between the die and the underfill material and between the underfill material and the substrate. The general formula of an organosilane shows two classes of functionality.

$R_n SiX_{(4-n)}$

The X group is the reaction with the inorganic or organic substrate. The bond between X and the silicon atom in coupling agents is replaced by a bond between the inorganic or organic substrate and the silicon atom. X is a hydrolyzable group, typically, alkoxy, acyloxy, amine,or chlorine. R is a nonhydrolyzable organic radical that possesses a functionality which enables the coupling agent to bond with organic resins and polymers. The silanes which can be used in the epoxy based no-flow underfill materials are selected from the amine, epoxy, mercapto, and styryl types. Particularly, the amine type silane coupling agent is the one that has at least one amino functional group. They are selected from the group of the 4-amino butyl dimethyl methoxy silane, N-(2-amino ethyl)-3-amino propyl methyl dimethoxy silane, N-(2-amino ethyl)-3-amino propyl trimethoxy silane, 3-amino propyl methyl diethoxy silane, 3-amino propyl triethoxy silane, 3-amino propyl trimethoxy silane and the like. The epoxy type silane coupling agent is the one that has at least one epoxy functional group, They are selected from the group of 2-(3,4-epoxy cyclohexyl)ethyl trimethoxy silane, (3-glycidoxy propyl) bis(trimethyl siloxy)-methyl silane, 3-glycidoxy propyl diisopropyl ethoxy silane, 3-glycidoxy propyl dimethyl ethoxy silane, 3-glycidoxy propyl) methyl diethoxy silane, 3-glycidoxy propyl methyl diisopropenoxy silane, 3-glycidoxy propyl trimethoxy silane and the like. Mercapto type silane coupling agent is the one that has at least one mercapto functional group. They are selected from the groups of the 3-mercapto propyl methyl dimethoxy silane, 3-mercapto propyl trimethoxy silane, (mercapto methyl) dimethyl ethoxy silane, (mercapto methyl) methyl diethoxy silane, 3-mercapto propyl triethoxy silane and the like. Styryl type silane coupling agent is the one that has at least one styryl functional group. They are selected from the group of the styryl ethyl trimethoxy silane, 3-(N-Styryl methyl-2-amino ethyl amino)-propyl trimethoxy silane and the like.

The surfactant is a chemical substance which consists of a hydrophilic and a hydrophobic group. The surfactant used in the invention is selected from the non-ionic surfactants such as silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, and fatty alcohol polyoxyalkylene alkyl ethers. Particularly, the polyol-based polyoxyalkylenes are selected from the group of glycerol, sorbitol, pentaerythritol, trimethylolpropane and the like. FC series surfactants from 3M company, Tergitol series, Triton series, and Videt series surfactants from Union Carbide company are just several examples.

The epoxy material may also include various additives known to those skilled in the art. These additives include toughening agents and fillers which are often used to obtain desired physical, mechanical, or electrical properties of the cured formulation, such as low thermal coefficient of expansion (TCE) and better thermal or electrical conductivity The epoxy resin mixture is prepared by adding bisphenol A type epoxy resin, bisphenol F type epoxy resin, epoxy novolac resin, biphenyl type epoxy resin, naphthalene type epoxy resin and dicyclopentadiene-phenol type epoxy resin to cycloaliphatic epoxy resins at a ratio of 1 epoxide equivalent weight of cycloaliphatic epoxy resins with 0 to 2 epoxide equivalent weight of bisphenol A type epoxy resin, bisphenol F type epoxy resin, epoxy novolac resin, biphenyl type epoxy resin, naphthalene type epoxy resin and dicyclopentadiene-phenol type epoxy resin. The mixture of the epoxy resin mixture and organic carboxylic acid anhydride hardeners is made by mixing the epoxy resin mixture with the organic carboxylic acid anhydride hardeners at a ratio of 1 epoxide equivalent weight of the epoxy resin mixture with 0.1 to 2.0 anhydride ring equivalent weight of organic carboxylic acid anhydride hardeners. A ratio of 1 epoxide equivalent weight of the epoxy resin mixture to 0.6 to 1.0 anhydride ring equivalent weight of organic carboxylic acid anhydride hardeners is preferred.

The ratio at which the accelerator is used depends upon the type of accelerator that is employed. If 2-ethyl-4-methyl imidazole, triphenylphosphine, an onium borate compound, or an imidazolium salt is used, it is added at a ratio of 0.05 to 20 part, by weight, to 100 parts mixture of epoxy resin mixture and organic carboxylic acid anhydride hardeners. A metal acetylacetonate is added at a ratio of 0.01 to 10 part, by weight, to 100 parts mixture of epoxy resin mixture and organic carboxylic acid anhydride hardeners.

The fluxing agents are added at a ratio of 0.1 to 10 part, by weight, to 100 parts of the mixture of the epoxy resin mixture and organic carboxylic acid anhydride hardeners.

The viscosity controlling agent is added at a ratio of 0.1 to 10 part, by weight, to 100 parts of the mixture of the epoxy resin mixture and organic carboxylic acid anhydride hardeners.

The silane coupling agent, or surfactant is added at a ratio of 0.01 to 10 part, by weight, to 100 parts mixture of epoxy resin mixture and organic carboxylic acid anhydride hardeners.

The preferred compositions of the present invention are substantially free (e.g., less than 0.2% by weight), if not completely free, of non-reactive organic solvents The following, non-limiting examples, are presented to further illustrate the present invention.

EXAMPLE 1

A formulation containing 50 parts by weight of 3,4-epoxycyclohexylmethyl-3,4-epoxycyclohexane carboxylate (Union Carbide ERL-4221), about 50 parts by weight of methyl hexahydrophthalic anhydride, about 0.2 part by weight cobaltous acetylacetonate, about 1 part by weight glycerol, about 2 parts by weight treated amorphous fumed silica, about 0.5 part by weight Beta-(3,4-epoxycyclohexyl)-ethyltrimethoxysilane. This formulation is identified as A. The formulation A shows suitable viscosity for no-flow processing, good wetting activity to normal eutectic Sn/Pb solder bump, good adhesion to chips and substrates and high Tg (TMA Tg is more than 170° C.).

EXAMPLE 2

A formulation containing 50 parts by weight of 3,4-epoxycyclohexylmethyl-3,4-epoxycyclohexane carboxylate (Union Carbide ERL-4221), about 50 parts by weight of methyl hexahydrophthalic anhydride, about 0.4 part by weight cobaltous acetylacetonate, about 0.5 parts by weight triphenylphosphine, about 1.0% by weight glycerol, about 2 parts by weight treated amorphous fumed silica, about 0.5 part by weight Beta-(3,4-epoxycyclohexyl)-ethyltrimethoxysilane. This formulation is identified as B. The formulation B not only shows similar properties of formulation A, but also high curing rate as such it does not need any post-curing after going through the reflow oven.

While the invention has been explained in relation to its preferred embodiments, it is to be understood that various modifications thereof will become apparent to those skilled in the art upon reading this specification. The aforementioned examples and embodiments are therefore, to be considered in all respects as illustrative rather than restrictive, and the invention is not to be limited to the details given therein. Therefore, it is to be understood that the invention disclosed herein is intended to cover such modifications as fall within the scope of the appended claims.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A no-flow underfill material obtained by curing a formulation comprising:
   a. an epoxy resin and/or a mixture of epoxy resins, said epoxy resin or said mixture having more than one 1,2-epoxy group per molecule;
   b. an organic carboxylic acid anhydride hardener;
   c. a latent curing accelerator adapted to allow a curing reaction of said epoxy resin and/or said mixture to occur at a temperature range of 180° C. to 240° C., said curing accelerator being selected from the group consisting of triphenylphosphine, alkyl-substituted imidazoles, imidazolium salts, onium borates, metal chelates, and mixtures thereof;
   d. a fluxing agent selected from chemicals having at least one hydroxyl (—OH) group;
   e. fumed silica;
   f. a coupling agent; and
   g. a surfactant.

2. A no-flow underfill material as claimed in claim 1, wherein said epoxy resin is selected from the group consisting of cycloaliphatic epoxy resins, bisphenol A epoxy resins, bisphenol F epoxy resins, epoxy novolac resins, biphenyl epoxy resins, naphthalene epoxy resins, dicyclopentadiene-phenol epoxy resins, and mixtures thereof.

3. A no-flow underfill material as claimed in claim 1, wherein said organic carboxylic acid anhydride hardener is selected from the group consisting of hexahydrophthalic anydride, methyl hexahydrophthalic anhydride, and mixtures thereof.

4. A no-flow underfill material as claimed in claim 1, wherein said alkyl-substituted imidazole is 2-ethyl-4-methyl imidazole.

5. A no-flow underfill material as claimed in claim 1, wherein said imidazolium salts are selected from the chemicals of the chemical structure as follows:

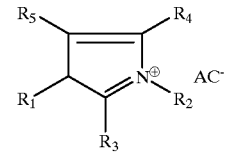

where $R_1$, $R_2$, $R_3$, $R_4$, and $R_5$, can be the same or different and are selected from the group consisting of H, $C_{1-6}$ alkyls, and phenyl; and the anionic counter ion $AC^-$ is selected from the group consisting of $I^-$, $Br^-$, $Cl^-$, $OAc^-$, $AcAc^-$, $BF_4^-$, $PF_6^-$, $AsF_6^-$, and $SbF_6^-$.

6. A no-flow underfill material as claimed in claim 1, wherein said onium borate is selected from the chemicals of the chemical structure as follows:

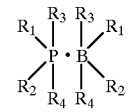

where $R_1=R_2=$phenyl; and $R_3$ and $R_4$ are selected from the group consisting of phenyl and $C_{1-10}$ alkyls.

7. A no-flow underfill material as claimed in claim 1, wherein said metal chelates are selected from the group consisting of metal acetylacetonates, metal acetates, metal halides, metal imidazole complexes, and metal amine complexes and said metal ions are selected from the group consisting of $Sc^{3+}$, $Cu^{2+}$, $Mo^{2+}$, $Ru^{3+}$, $Rh^{3+}$, $Cd^{2+}$, $La^{3+}$, $Hf^{4+}$, $In^{3+}$, $Tl^{1+}$, $Tl^{3+}$, $Pb^{2+}$, $Pb^{3+}$, $Ti^{4+}$, $Ce^{3+}$, $Ce^{4+}$, $Pr^{3+}$, $Eu^{3+}$, $Gd^{3+}$, $Tb^{3+}$, $Dy^{3+}$, $Ho^{3+}$, $Er^{3+}$, $Tm^{3+}$, $Lu^{3+}$, $Th^{3+}$, $Co^{2+}$, $Co^{3+}$, $Fe^{2+}$, $Fe^{3+}$, $Ni^{2+}$, $Pd^{2+}$, $Pt^{2+}$, $Ga^{3+}$, $Y^{3+}$, $V^{3+}$, $Sm^{3+}$, $Nd^{3+}$, $Cr^{3+}$, $Li^{1+}$, $Be^{2+}$, $K^{1+}$, $Ca^{2+}$, $Na^{1+}$, $Ba^{2+}$, $Sr^{2+}$, $Zn^{2+}$, and $Mg^{2+}$.

8. A no-flow underfill material as claimed in claim 1, wherein said fumed silica is selected from the group consisting of treated amorphous fumed silica and untreated amorphous fumed silica.

9. A no-flow underfill material as claimed in claim 1, wherein said coupling agent is selected from the group consisting of silane coupling agents.

10. A no-flow underfill material as claimed in claim 9, wherein said silane coupling agents are selected from the group consisting of epoxy silane coupling agents, amine silane coupling agents, mercapto silane coupling agents, and mixtures thereof.

11. A no-flow underfill material as claimed in claim 1, wherein said surfactant is selected from the group consisting of non-ionic surfactants.

12. A no-flow underfill material as claimed in claim 11, wherein said surfactant is selected from the group consisting of silicones, polyoxyethylene/polyoxypropylene block copolymers, ethylene diamine-based polyoxyethylene/polyoxypropylene block copolymers, polyol-based polyoxyalkylenes, fatty alcohol-based polyoxyalkylenes, and fatty alcohol polyoxyalkylene alkyl ethers.

13. A no-flow underfill material as claimed in claim 1, wherein said fluxing agent is selected from the group consisting of ethylene glycol, glycerol, 3-1,2-propane diol, D-ribose, D-cellobiose, cellulose, and 3-cyclohexene-1,1-dimethanol.

14. A no-flow underfill material as claimed in claim 1, further comprising a filler material.

15. A no-flow underfill material as claimed in claim 14, wherein said filler material is selected from the group consisting of silica particles, silicon nitride particles, and aluminum nitride particles.

* * * * *

UNITED STATES PATENT AND TRADEMARK OFFICE
CERTIFICATE OF CORRECTION

PATENT NO.   : 6,180,696 B1
DATED         : January 30, 2001
INVENTOR(S)  : Wong, et al.

Page 1 of 1

It is certified that error appears in the above-identified patent and that said Letters Patent is hereby corrected as shown below:

Column 5,
Line 9, replace "chemicals. So" with -- chemicals, so --.
Line 49, replace "prarameter" with -- parameter --.

Column 9,
Line 65, after the phrase "YX4000H", please insert the trademark symbol -- ™ --.

Column 10,
Line 24, after the phrase "HP -- 4032", please insert the trademark symbol -- ™ --.
Line 25, after the phrase "EXA - 4700", please insert the trademark symbol -- ™ --.

Column 11,
Line 13, after the phrase "HP - 7200", please insert the trademark symbol -- ™ --.

Column 13,
Line 34, after the phrase "TS - 720", please insert the trademark symbol -- ™ --.
Line 35, after the phrase, "CAB-O-SIL M-5", please insert the trademark symbol -- ™ --.

Column 15,
Line 27, after the phrase "ERL -- 4221",. please insert the trademark symbol -- ™ --.

Signed and Sealed this

Twenty-eighth Day of August, 2001

Attest:

*Nicholas P. Godici*

NICHOLAS P. GODICI
*Attesting Officer*   *Acting Director of the United States Patent and Trademark Office*